United States Patent [19]

Nakauchi

[11] Patent Number: 5,675,269

[45] Date of Patent: Oct. 7, 1997

[54] SEMICONDUCTOR DEVICE INCLUDING RESISTOR HAVING PRECISE RESISTANCE VALUE

[75] Inventor: Osamu Nakauchi, Tokyo, Japan

[73] Assignee: NEC Corporation, Japan

[21] Appl. No.: 543,293

[22] Filed: Oct. 16, 1995

[30] Foreign Application Priority Data

Oct. 26, 1994 [JP] Japan ..................... 6-262133

[51] Int. Cl.$^6$ ............................................. H03K 5/153
[52] U.S. Cl. ........................ 327/77; 327/89; 327/530; 327/535
[58] Field of Search ......................... 327/52, 530, 72, 327/534, 73, 535, 77, 89

[56] References Cited

U.S. PATENT DOCUMENTS

| 4,647,841 | 3/1987 | Miller ....................... 327/530 |
| 4,990,845 | 2/1991 | Gord ......................... 327/530 |
| 5,091,663 | 2/1992 | Ishizaki et al. ............... 327/52 |
| 5,309,399 | 5/1994 | Murotani ..................... 327/530 |
| 5,485,117 | 1/1996 | Furumochi .................... 327/73 |

FOREIGN PATENT DOCUMENTS

| 3-226008 | 10/1991 | Japan . |
| 4-208517 | 7/1992 | Japan . |

Primary Examiner—Timothy P. Callahan
Assistant Examiner—Jeffrey Zweizig
Attorney, Agent, or Firm—Hayes, Soloway, Hennessey, Grossman & Hages, P.C.

[57] ABSTRACT

This invention provides a semiconductor device including a circuit having a resistor element whose resistance value can be controlled via application of a control voltage, and permits the circuit to be designed stably without requiring labor and time for adjustment of the control voltage to be applied to the resistor element for precisely controlling resistance of the resistor element, and without increasing chip area. One preferred embodiment includes a reference resistor, such as a carbon film resistor or a chip resistor having a dispersion of approximately ±1% and having a very highly stable resistance value, and a diffused layer resistor which is used as the resistor element. The diffused layer resistor has a dispersion of approximately ±30% in a LSI circuit. The reference resistor and diffused layer resistor are connected in series between a power source voltage and ground potential, and the potential at the junction between the reference resistor and the resistor element is inputted to the negative input terminal of an inverting amplifier. A potential equal to one half the power source voltage is inputted to the positive input terminal of the inverting amplifier, and the output of the inverting amplifier is fed back as the control voltage for controlling the resistance of the diffused layer resistor, so that the potentials of the positive and negative input terminals of the inverting amplifier become equal.

8 Claims, 7 Drawing Sheets

SEMICONDUCTOR DEVICE INCLUDING RESISTOR HAVING PRECISE RESISTANCE VALUE

BACKGROUND OF THE INVENTION

1. Field of the Invention

This invention relates to a semiconductor device, and more particularly to a semiconductor device which employs a resistor element for which absolute accuracy is required.

2. Description of Related Art

Conventionally, when absolute accuracy is required for the resistance value of a resistor element to be formed in or on a semiconductor substrate, various countermeasures have been taken, such as, for example, to provide the resistor element with a comparatively widened width upon layout, or, where the resistor element is formed from polycrystalline silicon, to place a dummy resistor pattern around the resistor element in order to reduce dispersion of resistance value caused by etching. However, dispersion caused in the manufacturing procedure still cannot be prevented, and circuit design is formulated with the recognition that some dispersion cannot be avoided.

Therefore, in conventional semiconductor devices, it is a common countermeasure that a fuse is provided in the inside of a circuit for which absolute accuracy is required, and the resistance value of the circuit is readjusted after the manufacturing procedure of a wafer is completed.

It is another common countermeasure that a control voltage is applied to a resistor element from the outside to control the resistance value of the resistor element.

The voltage controlled conventional semiconductor device is described below with reference to FIG. 1.

FIG. 1 is a circuit diagram showing construction of a circuit of an example of a conventional semiconductor device and FIG. 2 is a sectional view showing an example of a construction of a substrate including a diffused layer resistor which is a resistor element comprised within a conventional semiconductor device.

The conventional semiconductor device includes, as shown in FIG. 1, diffused layer resistor $R_{10}$ which is a resistor element designed to have a resistance value of 5 k$\Omega$ in an LSI circuit having a dispersion of value within approximately ±30%. Diffused layer resistor $R_{10}$ is connected to power source voltage $V_{cc}$ and is grounded at the other terminal thereof. Further, a controlling voltage $V_a$ is applied to C terminal 535 (refer to FIG. 2) of diffused layer resistor $R_{10}$. The resistance value of diffused layer resistor $R_{10}$ is varied by increasing or decreasing the controlling voltage. Similarly, the resistance values of diffused layer resistors $R_{11}$ and $R_{12}$ (FIG. 1) used in another circuit in the same chip are controlled by applying the same controlling voltage to them.

The substrate including a diffused layer resistor shown in FIG. 2 includes $N^+$ buried layer 585 formed on P-type silicon substrate 510, N-type diffused layer 590 formed from an N-type epitaxial layer on $N^+$ buried layer 585, and P-type impurity layer 530, which serves as a P-type diffused layer resistor, and $N^+$ diffused layer 540 both formed in the inside of N-type diffused layer 590. Here, N-type diffused layer 590 is provided independently in order to vary the substrate bias. The semiconductor substrate having the construction just described has A terminal 515 and B terminal 525 serving as a pair of terminals of the P-type diffused layer resistor, and C terminal 535 as a control terminal for controlling the potential of N-type diffused layer 590.

With the construction described above, the diffused layer resistor which is P-type impurity layer 530 between A terminal 515 and B terminal 525 does not have the required resistance value because of a dispersed resistance value with respect to a designed value due to dispersion in manufacture.

Therefore, an external voltage $V_a$ is applied from C terminal 535 to adjust the potential of N-type diffused layer 590 provided independently for the diffused layer resistor. Consequently, a depletion layer is expanded on a PN junction plane between P-type impurity layer 530 and N-type diffused layer 590 so that the electric current between A terminal 515 and B terminal 525 is controlled and the resistance value between A terminal 515 and B terminal 525 is controlled.

In the conventional semiconductor device described above which includes a resistor element whose resistance value is controlled, since an adjusted control voltage has to be applied to the control terminal from the outside to set a resistance value, there is a problem in that much labor and time are required for the adjustment.

Further, where the countermeasure to provide the resistor element with an increased width upon layout or to surround, where the resistor element is formed from polycrystalline silicon, the resistor element with a dummy pattern is taken in order to reduce the dispersion of the resistor value in manufacturing, the chip area is increased so much that a significant effect cannot be anticipated, which is another problem of the conventional semiconductor device.

Furthermore, since formation of the resistor element on the same substrate together with another element which forms a combined circuit results in a cause of a malfunction, they must be formed on separate substrates, and accordingly, the conventional semiconductor device has a further problem in that it is disadvantageous in terms of layout.

Further, when the potential of the N-type diffused layer is varied, the parasitic capacitance values of the N-type diffused layer and the P-type silicon substrate are varied by the bias, which is a still further problem of the conventional semiconductor device.

SUMMARY OF THE INVENTION

It is an object of the present invention to provide a semiconductor device wherein, solving the problems of the conventional semiconductor device described above, a circuit in which a resistor element for which absolute accuracy is required is employed can be designed stably without requiring labor and time for adjustment of a voltage to be applied and without increasing the chip area.

In order to attain the object described above, according to the present invention, there is provided a semiconductor device which includes a resistor internally and on a semiconductor substrate, and a voltage input terminal for controlling resistance value of the resistor element, comprising a reference resistor connected in series to the resistor element and having a high degree of stability of a resistance value equal to an expected resistance value of the resistor element, and an adjustment circuit for feeding back an output thereof to a control terminal of the resistor element to adjust the resistance value of the resistor element toward the resistance value of the reference resistor.

Preferably, the adjustment circuit is an inverting amplifier having a positive terminal to which a voltage equal to one half the voltage to be applied to the resistor element passing through the reference resistor and a negative terminal to which a junction between the resistor element and the reference resistor is connected, the control terminal being connected to an output terminal of the inverting amplifier so that a potential at the junction between the resistor element and the reference resistor is made equal to the voltage applied to the positive terminal.

Further, an output terminal of the adjustment circuit may be connected to a control terminal of at least one other resistor element in the same semiconductor device.

BRIEF DESCRIPTION OF THE DRAWINGS

FIG. 6 is replaced with the resistance value between A terminal and B terminal.

DESCRIPTION OF THE PREFERRED EMBODIMENT

An embodiment of the present invention is described below with reference to the drawings.

Figure 1:
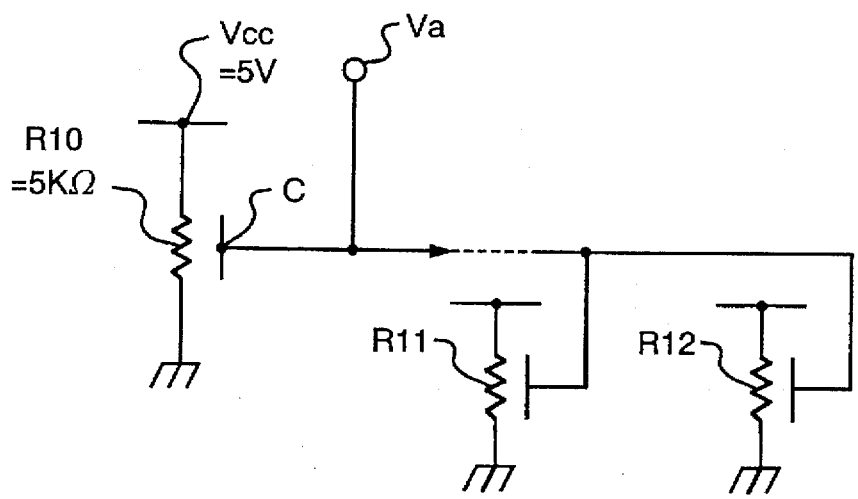
FIG. 1 is a circuit diagram showing construction of a circuit of an example of a conventional semiconductor device.
Figure 2:
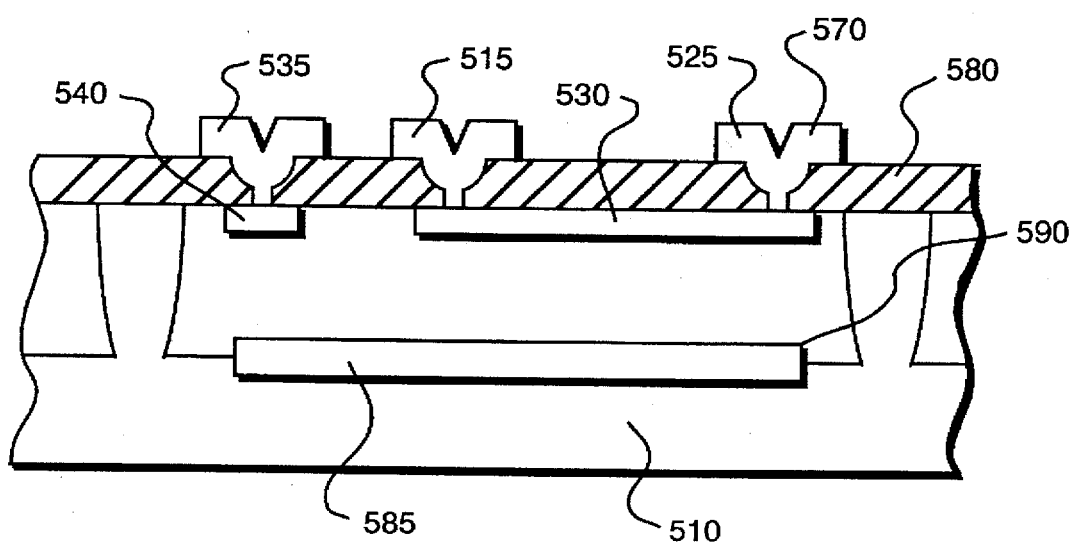
FIG. 2 is a sectional view showing an example of a construction of a substrate including a diffused layer resistor which is a resistor element of the semiconductor device shown in FIG. 1.
Figure 3A:
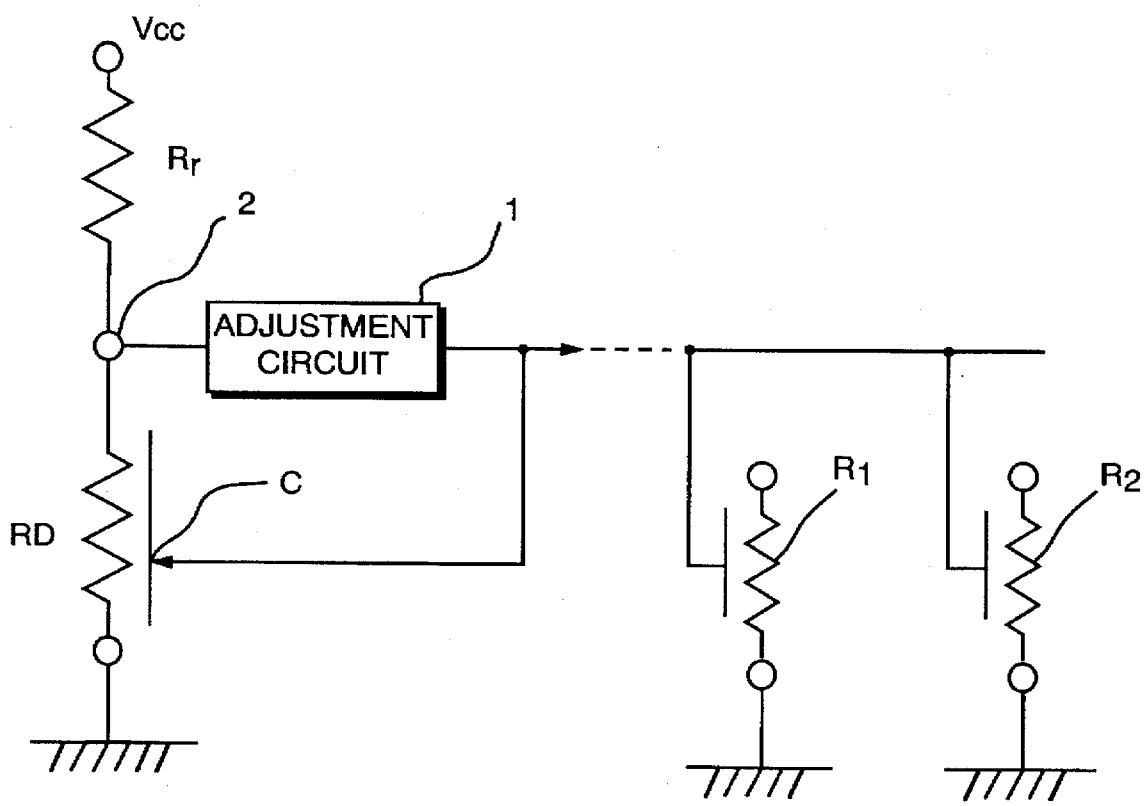
FIG. 3(a) is a circuit diagram showing a construction of a circuit of an embodiment of a semiconductor device of the present invention.

FIG. 3(a) is a circuit diagram showing construction of a circuit of an embodiment of a semiconductor device of the present invention.

The semiconductor device of the present embodiment includes a, reference resistor $R_r$ such as a carbon film resistor or a chip resistor of 5 kΩ having a high degree of stability in resistance value, e.g. within dispersion of approximately 1%, and diffused layer resistor RD which is a resistor element designed to have a resistance of 5 kΩ in an LSI circuit and having a dispersion of value within approximately ±30%. Reference resistor $R_r$ and diffused layer resistor RD are connected in series between power source voltage $V_{cc}$ of 5 V and the ground, and the potential at the junction point 2 between the two resistors is inputted to adjustment circuit 1. Adjustment circuit 1 outputs voltage a feedback into the controlling terminal C (refer to FIG. 4(b)) provided for diffused layer resistor RD to apply an appropriate voltage to make resistor RD become 5 kΩ and monitors the potential at junction point 2.

Figure 3B:
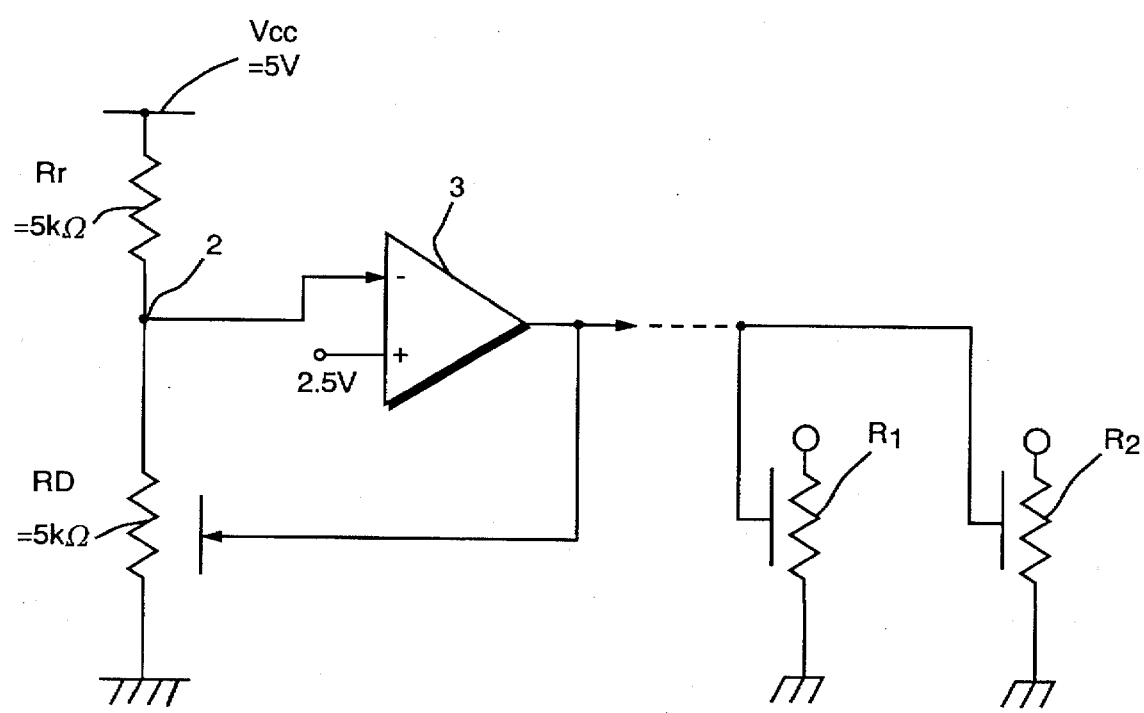
FIG. 3(b) is a circuit diagram employing an inverting amplifier for adjustment circuit 1 in FIG. 3(a)

FIG. 3(b) is a circuit diagram showing construction of an embodiment of a semiconductor device employing an inverting amplifier 3 for the adjustment circuit 1 shown in FIG. 3(a).

In this embodiment, the potential at junction point 2 between the two resistors is inputted to the negative input terminal of inverting amplifier 3. Further, an ideal potential at the junction point 2, in this instance, 2.5 V is connected to the positive input terminal of inverting amplifier 3, and the output of inverting amplifier 3 in this instance is fed back to controlling C terminal (refer to FIG. 4(b)) provided for diffused layer resistor RD.

Further, by feeding back the output of inverting amplifier 3 to resistors $R_1$ and $R_2$ used in another circuit in the same chip, resistors $R_1$ and $R_2$ are made to have stable resistance values.

Figure 4A:
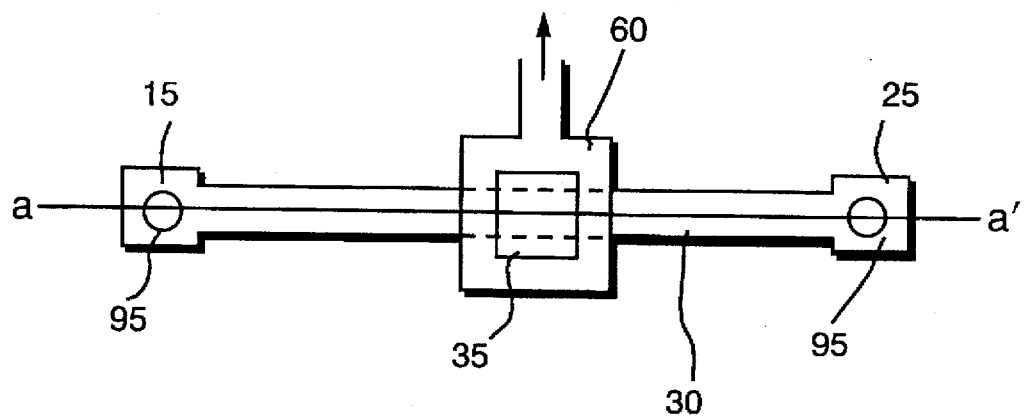
FIG. 4(a) is a plan view of a schematic layout of a diffused layer resistor which is a resistor element shown in FIG. 3.
Figure 4B:
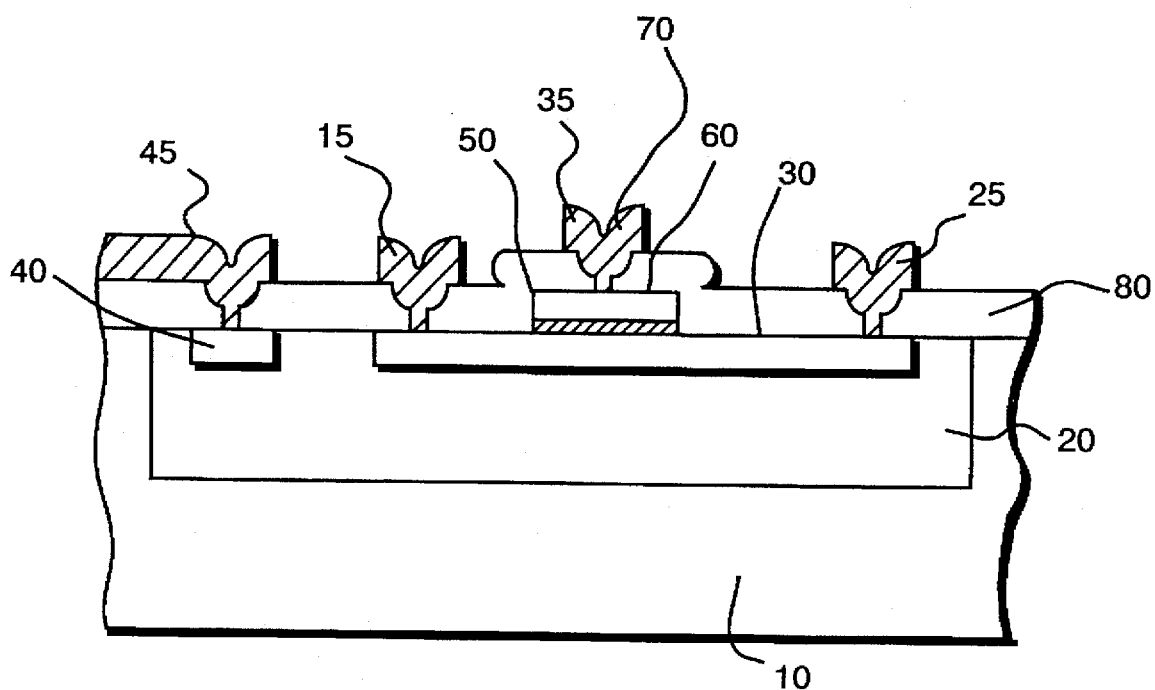
FIG. 4(b) is a sectional view taken along line a—a' of FIG. 4(a) showing the semiconductor device of the present invention.

FIG. 4(a) is a view showing a schematic layout of the diffused layer resistor of the semiconductor element of the present invention, and FIG. 4(b) is a sectional view showing a perpendicular plane of FIG. 4(a) along line a—a' of FIG. 4(a) showing the semiconductor device of the present invention.

The substrate including the diffused layer resistor which forms the semiconductor device of the present embodiment includes, as shown in FIG. 4(b), N well region 20 provided on P-type silicon substrate 10, and P-type impurity layer 30, which serves as a diffused layer resistor, and $N^+$ diffused layer 40 both provided inside of N well region 20. The semiconductor substrate of the structure just described has A terminal 15 and B terminal 25 as the opposite terminals of the diffused layer resistor, and C terminal 35 and controlling electrode 60 for applying a voltage to P-type impurity layer 30 which is the diffused layer resistor. Further, oxide film 50 is formed under controlling electrode 60, and inter-layer film 80 is provided between the substrate and the terminals. Further, D terminal 45 is provided for providing a maximum potential to the N well region.

Further, as shown in FIGS. 4(a) and 4(b), controlling electrode 60 (C terminal 35) is provided on P-type impurity layer 30, and P-type impurity layer 30 forms the diffused layer resistor. A terminal 15 and B terminal 25 for supplying electric current to the diffused layer resistor by way of wiring lines connected to contacts 95 are provided on the opposite ends of the diffused layer resistor.

The process of manufacturing the substrate in which the diffused layer resistor described above is built is described with reference to FIG. 4(b) including manufacture of a MOS transistor. However, several steps having no relation to the present invention are omitted herein.

First, phosphorus ions, which are an N-type impurity, are injected at a dose amount of $2\times10^{13}$ atom/cm$^2$ and acceleration energy of 150 keV into P-type silicon substrate 10 whose atom concentration is $1\times10^{15}$ atom/cm$^3$, and then, pushing-in is performed at 200° C. for about 8 hours to form N well region 20.

Figure 5:
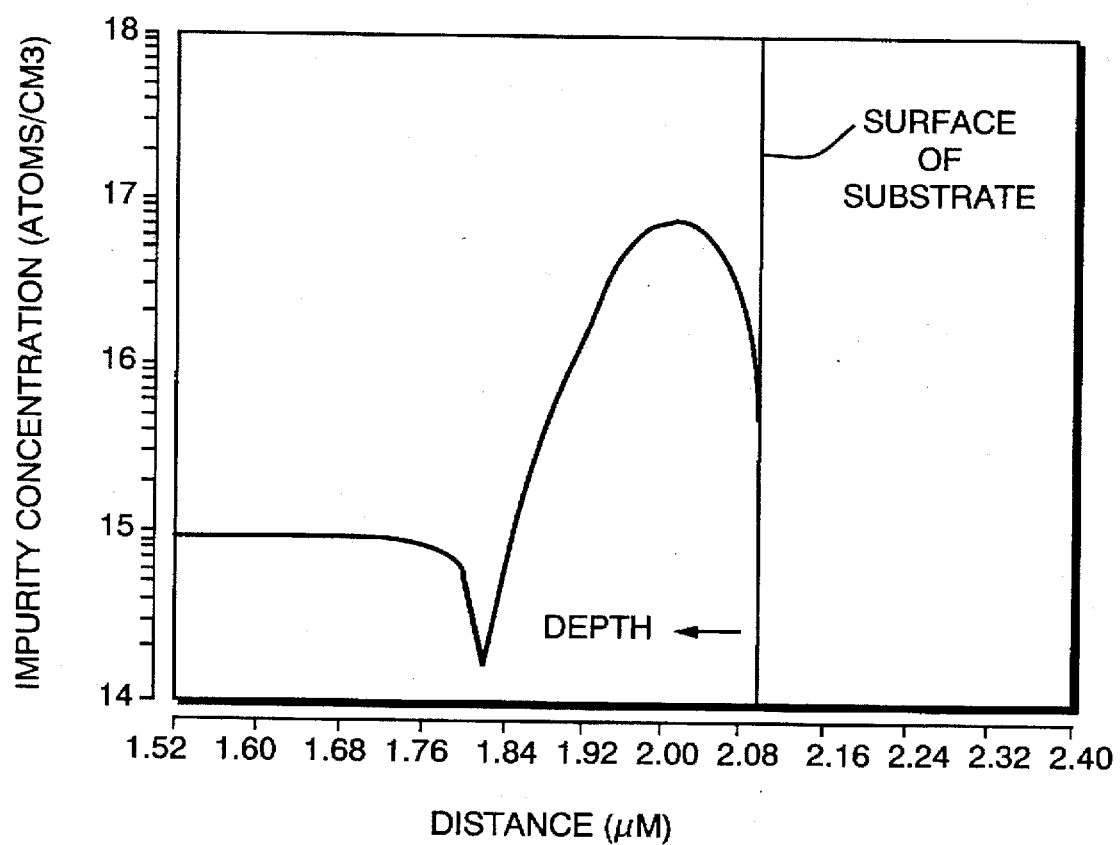
FIG. 5 is a graph showing a result of simulation of an impurity concentration distribution when P-type impurity layer 30 is formed.

Then, boron ions, which are a P-type impurity, are implanted at a dose amount of $1\times10^{12}$ atom/cm$^2$ and acceleration energy of 30 keV into the inside of N well region 20 to form P-type impurity layer 30 whose sheet resistivity ρs is 0.6 kΩ/μm²□. Formation of P-type impurity layer 30 can be performed simultaneously with boron injection into the gate for controlling threshold voltage Vth of a MOS transistor in order to reduce manufacturing steps. FIG. 5 is a graph showing result of simulation of the impurity atom concentration profile when P-type impurity layer 30 is formed.

Then, in order to form the gate electrode of the MOS transistor, N-type polycrystalline silicon is accumulated to a thickness of 400 nm and then patterning is performed. Thereupon, controlling electrode 60 of the resistor element is formed. Then, oxide film 50 of a thickness of 30 nm is present under controlling electrode 60. Oxide film 50 corresponds to a gate oxide film of the MOS transistor.

Finally, inter-layer film 80 is accumulated, and A terminal 15, B terminal 25 and C terminal 35 are formed from aluminum wiring lines 70 and provided at the opposite ends of P-type impurity layer 30. D terminal 45 is a terminal for providing N well region 20 with a maximum potential by way of aluminum wiring line 70 and N⁺ diffused layer 40.

Next, operation of diffused layer resistor RD produced by the steps described above is described.

When the layout of diffused layer resistor RD whose sheet resistivity ρs is 0.6 kΩ/μm²☐ is designed with W/L=⅕ μm, the resistance between A terminal 15 and B terminal 25 is 0.6×5=3 kΩ. However, if the resistance disperses within ±30% among different lots due to dispersion in manufacture, a design margin of 2.1 to 3.9 Ω must be taken into consideration.

Figure 6:
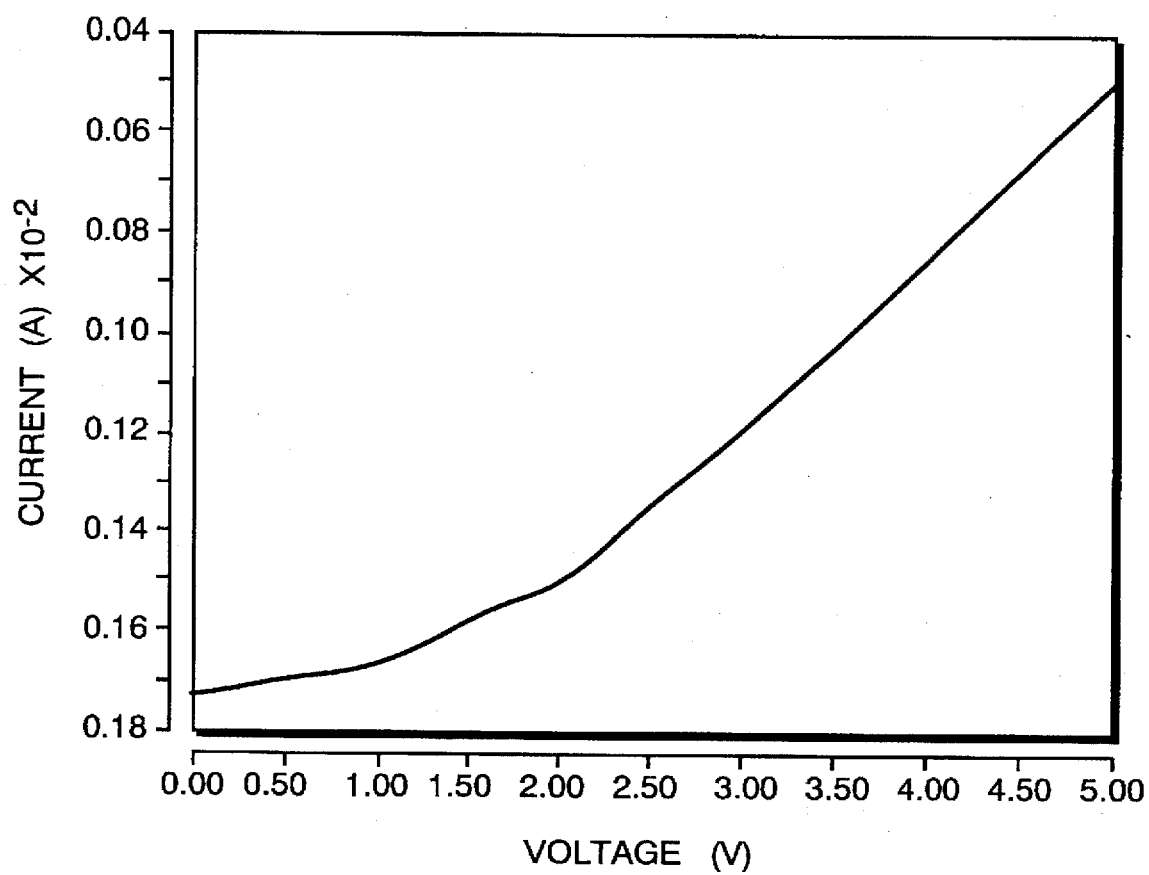
FIG. 6 is a graph showing a characteristic of the current value between an A terminal and a B terminal when the potential of a controlling electrode is varied from 0 to 5 V.
Figure 7:
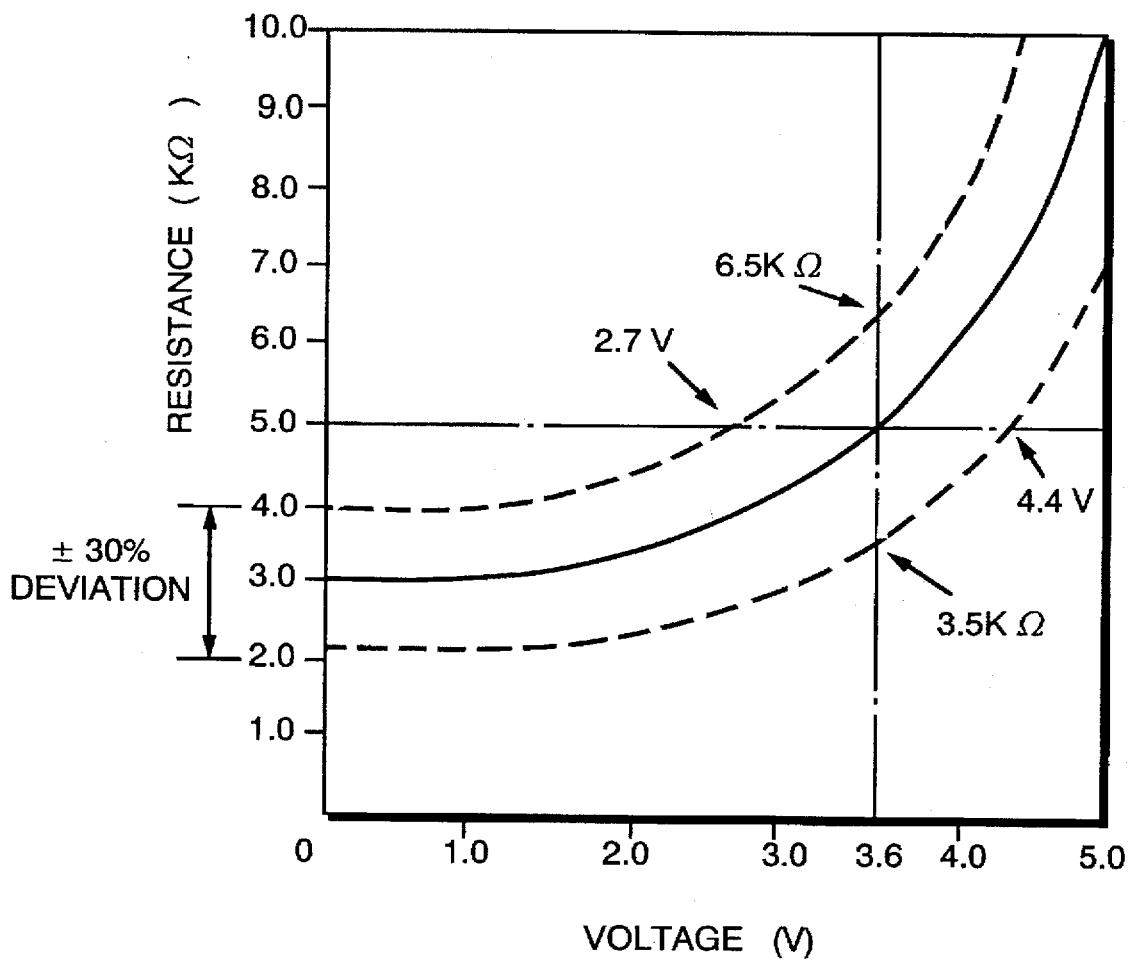
FIG. 7 is a graph of a characteristic when the characteristic of current shown

Here, the graph of the characteristics of the electric current value between A terminal 15 and B terminal 25 shown in FIG. 4(b) when the potential of controlling electrode 60 is varied from 0 to 5 V is shown in FIG. 6, and the graph when the characteristics of FIG. 6 is replaced with the resistance value between A terminal 15 and B terminal 25 is shown in FIG. 7.

Since P-type impurity layer 30 which is diffused layer resistor RD has controlling electrode 60 formed from N-type polycrystalline silicon on the opposite side to oxide film 50 (refer to FIG. 4(b)), it can be seen from FIG. 7 that, when the potential of controlling electrode 60 is varied from 0 to 5 V, resistance of diffused layer resistor RD can vary from 3 to 10 kΩ.

This phenomenon arises from the fact that, when a voltage is applied to controlling electrode 60, the movements of carriers between A terminal 15 and B terminal 25 are controlled because minority carriers of P-type impurity layer 30 are induced under controlling electrode 60 and form an inversion layer (not shown).

Here, if an inversion layer is formed, then since carriers are collected into the inversion layer, a depletion layer (not shown) in which little carriers are present is formed around the inversion layer. The depletion layer is expanded as the voltage applied to controlling electrode 60 rises. However, when the depletion layer extends to the junction of P-type impurity layer 30, the region of P-type impurity layer 30 is separated to a pinch-off condition due to the depletion layer, and consequently, the resistance value between A terminal 15 and B terminal 25 is saturated.

If the potential difference between A terminal 15 and B terminal 25 exceeds a threshold value, then the inversion layer is depleted causing punch-through, and therefore, care must be taken with regard to the atom concentration of P-type impurity layer 30 and the depth of the junction.

Next, it is described how the resistance value of diffused layer resistor RD described above is automatically controlled using the semiconductor device of the present embodiment.

As shown in FIG. 3(b), the designed circuit value of diffused layer resistor RD is set to 5 kΩ (the designed device value is 3 kΩ), and the output of inverting amplifier 1 is connected to controlling electrode 60 (FIG. 4(b)). Three conditions in which the resistance value of diffused layer resistor RD is stabilized at 5kΩ in this instance are described below.

(1) When the resistance value of diffused layer resistor RD is dispersed to plus 30%, the designed device value of 3 kΩ is dispersed to 3.9 kΩ, and this means that, when the designed circuit value is 5 kΩ, the designed circuit value is dispersed to 6.5 kΩ as seen from a broken line in FIG. 7.

In FIG. 3(b), since the reference value of reference resistor $R_r$ is 5 kΩ fixed and the resistance value of diffused layer resistor RD is 6.5 kΩ, the intermediate potential (potential at the junction between the two resistors) is $$5\,V \times \frac{6.5}{11.5} \approx 2.8\,V$$

and is inputted to the negative terminal of inverting amplifier 1. Since the reference voltage of inverting amplifier 1 is set to 2.5 V, the output of inverting amplifier 1 is fed back to controlling electrode 60 so that the input to the negative terminal of inverting amplifier 1 may be equal to 2.5 V, whereupon the voltage value applied to diffused layer resistor RD is varied and the resistance value is put into a steady condition. In particular, when the output of inverting amplifier 1 becomes equal to 2.7 V (shown in FIG. 7), the resistance value of diffused layer resistor RD becomes equal to 5 kΩ.

(2) When the resistance value of diffused layer resistor RD is dispersed to minus 30%, the designed device value of 3 kΩ is dispersed to 2.1 kΩ, and this means that, when the designed circuit value is 5 kΩ, it is dispersed to 3.5 kΩ as seen from another broken line of FIG. 7.

In FIG. 3(b), since the resistance value of reference resistor $R_r$ is fixed at 5 kΩ and the resistance value of diffused layer resistor RD is 3.5 kΩ, the intermediate potential is 2.1 V and is inputted to the negative terminal of inverting amplifier 1. Since the reference voltage of inverting amplifier 1 is set to 2.5 V, the output of inverting amplifier 1 is fed back to controlling electrode 60 so that the input to the negative terminal of inverting amplifier 1 may be equal to 2.5 V, whereupon the voltage value applied to diffused layer resistor RD is varied and the resistance value is put into a steady condition. In particular, when the output of inverting amplifier 1 becomes equal to 4.4 V, the resistance value of diffused layer resistor RD becomes equal to 5 kΩ.

(3) When the resistance value of diffused layer resistor RD is 5 kΩ and is not dispersed, the resistance value of diffused layer resistor RD becomes equal to 5 kΩ when the output of inverting amplifier 1 becomes equal to 3.6 V as described in (1) and (2) above.

As described above, with the semiconductor device of the present embodiment, since a voltage of a resistor used in the inside of an LSI is fed back to the resistor by way of an inverting amplifier or a like element using, as a reference, a resistor which is provided outside the LSI and has a resistance having a very high degree of accuracy (for example, a carbon film resistor or a chip resistor), a circuit in which a resistor element is employed for which absolute accuracy is required can be designed stably without requiring labor and time for adjustment of the voltage to be applied and without increasing the chip area while suppressing a dispersion caused by a process of manufacture by the circuit construction.

Further, while the resistance of diffused layer resistor RD in the present embodiment described above is automatically controlled to be set at 5 kΩ, by forming the present circuit once in the LSI chip and connecting the output of inverting amplifier 1 to controlling electrodes of other resistor elements by way of wiring lines, all of the resistors can be controlled similarly.

Here, the determination of the reference voltage of inverting amplifier 1 is described supplementarily. Even if the resistance value of each resistor is set to a designed value, if the power source voltage varies, then the intermediate potential is changed. Therefore, if a divided voltage of the power source voltage by means of resistors is used as the reference voltage for the inverting amplifier, then the reference voltage for the inversion amplifier also varies suitably when the power source voltage varies, and consequently, the intermediate voltage will not be displaced at all.

Since the present invention is constructed as described above, the following effects are exhibited.

1. Since a fixed voltage is applied to an input terminal of a resistor whose resistance value is to be controlled by reference resistor, such as a carbon film resistor which has a high degree of accuracy and has a resistance value equal to the resistance value expected for the resistor whose resistance value is to be controlled, connected in series to the resistor whose resistance value is to be controlled, and a circuit which feeds back voltage to make the resistance value of the resistor whose resistance value is to be controlled approach and become equal to the value of the reference resistor via a control terminal provided on the resistor whose resistance value is to be controlled, a circuit in which a resistor is employed for which accuracy is required can be designed stably without requiring labor and time for adjusting voltage to be applied to the control terminal of the resistor element.

2. Since an inverting amplifier is provided as the circuit which feeds back a voltage controlled by an inputted differential voltage between the resistor and the reference resistor to the control terminal of the resistor, whose resistance value is to be controlled, to cause the voltage, which is to be applied to the resistor, to approach the predetermined value and a voltage equal to one half the voltage applied to the input terminal of the reference resistor is applied to a positive terminal of the inverting amplifier circuit while a potential at a junction between the resistor and the reference resistor is applied to a negative terminal of the inverting amplifier and the control terminal provided on the resistor is connected to an output terminal of the inverting amplifier, the inverting amplifier varies the voltage applied to the control terminal until the voltages applied to the positive terminal and the negative terminal become equal to each other automatically, a circuit in which a resistor is employed for which accuracy is required can be designed stably without requiring labor and time for adjustment of the voltage to be applied to the control terminal of the resistor element.

3. Since the circuit which feeds back the voltage controlled by the inputted differential voltage between the resistor whose resistance value is to be controlled and the reference resistor to the control terminal of the resistor to cause the voltage, which is to be applied to the resistor whose resistance is to controlled, to approach and become equal to the predetermined value is connected in parallel to control terminals of a plurality of resistors whose resistance values are to be controlled within the same LSI, the resistance values of all of the resistors whose resistance values are to be controlled connected to the feed back circuit can be caused to approach and become equal to the resistance value of the reference resistor.

What is claimed is:

1. A semiconductor device comprising:

at least one resistor element whose actual resistance is controllable by a control voltage applied to said at least one resistor element via a control terminal, said at least one resistor element having a desired nominal resistance value;

a precision reference resistor connected in series to said at least one resistor element and having a precise resistance value which remains substantially stable and which is equal to the desired resistance value of said at least one resistor element, said reference resistor being connected between an input power terminal and said at least one resistor element; and an adjustment circuit for generating said control voltage, said adjustment circuit being connected between the reference resistor and the control terminal, and generating said control voltage so as to cause said actual resistance of said at least one resistor element to become equal to the resistance value of said reference resistor.

2. A semiconductor device as claimed in claim 1, wherein the adjustment circuit is an inverting amplifier having a positive terminal to which a voltage equal to one half voltage applied to the reference resistor via the input power terminal is connected, and a negative terminal connected to a junction between the at least one resistor element and the reference resistor, the control terminal being connected to an output terminal of said inverting amplifier, said amplifier being adapted to cause potential at the junction to become equal to the voltage applied to said positive terminal.

3. A semiconductor device as claimed in claim 1, further comprising at least one other resistor element controllable by a respective control voltage applied to a respective control terminal of said other element, and wherein an output terminal of the adjustment circuit is connected to the respective control terminal of the at least one other resistor element.

4. A semiconductor device as claimed in claim 2, further comprising at least one other resistor element whose resistance is controllable by a respective control voltage applied to a respective control terminal of said other element, and wherein the output terminal of the amplifier is connected to the respective control terminal of the other resistor element.

5. A semiconductor device as claimed in claim 1, wherein said at least one resistor element has a resistance value dispersion within about ±30% of said desired resistance value.

6. A semiconductor device as claimed in claim 1, wherein said reference resistor has a resistance value dispersion within about ±1% of said desired resistance value.

7. A semiconductor device as claimed in claim 1, wherein said at least one resistor element comprises a diffused layer resistor element.

8. A semiconductor device as claimed in claim 1, wherein said reference resistor is one of a carbon film resistor and a chip resistor.

* * * * *